United States Patent [19]

Jones

[11] 4,396,479
[45] Aug. 2, 1983

[54] ION ETCHING PROCESS WITH MINIMIZED REDEPOSITION

[75] Inventor: Addison B. Jones, Yorba Linda, Calif.

[73] Assignee: Rockwell International Corporation, El Segundo, Calif.

[21] Appl. No.: 355,445

[22] Filed: Apr. 30, 1982

Related U.S. Application Data

[62] Division of Ser. No. 206,929, Nov. 14, 1980, Pat. No. 4,337,132.

[51] Int. Cl.$^3$ .............................................. C23C 15/00
[52] U.S. Cl. ............................... 204/192 E; 156/643; 156/652; 156/653; 156/657; 204/192 EC
[58] Field of Search .................... 204/192 E, 192 EC; 156/657, 643, 653, 652

[56] References Cited

U.S. PATENT DOCUMENTS 4,139,442  2/1979  Bondur ............................ 204/192 E

OTHER PUBLICATIONS

Lee J. Vac. Sci. Technol. 16(1979) pp. 164–170.
Mellvar–Smith J. Vac. Sci–Tech. 13(1976) pp. 1006–1022.
Bartush et al. IBM Tech. Disc. Bull 21(1978) pp. 1868–1869.
Cantagrel J. Vac. Sci. Technol. 12(1975) pp. 1340–1343.
Funayama et al. J. Vac. Sci. Technol. 15(1978) pp. 998–1000.

*Primary Examiner*—Arthur P. Demers
*Attorney, Agent, or Firm*—H. Fredrick Hamann; Wilfred G. Caldwell

[57] ABSTRACT

The invention is a method of minimizing redeposition of thin film material being removed by ion impact via a patterned resist mask, which invention determines the resist mask etching rates in selected atmospheres and determines the material etching rates in selected atmospheres. Then the mask thickness is selected relative to the material thickness, the ambient gases, and the ion beam parameters to cause the resist mask to be faceted to the edges of underlying material as the unprotected layer is removed such that no resist walls remain to receive redeposited material. A different embodiment of the invention employs a getter mask material between the resist mask and said material where the thickness and etching rates of resist, said material and getter material are relatively selected to cause the unprotected getter material to be removed shortly prior to faceting of the resist down to the protected getter material in a first environment, and continues etching the thin film material in a different environment which also causes resist removal while eroding the getter mask very slowly. The getter mask can thus be very thin to minimize redeposition.

4 Claims, 10 Drawing Figures

ION ETCHING PROCESS WITH MINIMIZED REDEPOSITION

RELATION OF THIS APPLICATION

This application is a division of U.S. Ser. No. 206,929, entitled ION ETCHING PROCESS WITH MINIMIZED REDEPOSITION, filed Nov. 14, 1980, by the same inventor, ADDISON BROOKE JONES, now U.S. Pat. No. 4,337,132.

FIELD OF THE INVENTION

The invention relates to the manufacture of VLSI circuitry and is a thin film patterning method achieving high resolution etching with vertical pattern sidewall and minimized redeposition, particularly suited to bubble memory manufacturing.

BACKGROUND ART

The closest known art is U.S. Pat. No. 4,098,917 to Bullock et al issued July 4, 1978. A metallic masking material, which may be titanium, is utilized in magnetic bubble domain technology. Successive layers of, first a magnetically soft material, then the metallic layer, then photoresist are deposited on a magnetic film. The metal layer is plasma etched to form a metal mask, the photoresist is stripped, followed by ion milling the magnetic layer using the patterned metal layer as the mask. The exposed regions of metallic mask material are subjected to a plasma etch for selective removal down to the magnetic soft material. The remaining portion of the layer of photosensitive material is then stripped, exposing the remaining portion of the layer of metallic masking material. Ion milling is then employed to remove the exposed layers from the magnetically soft material. The metal mask is finally stripped from the structure (to expose the magnetic bubble propagation path pattern of magnetically soft material) by a plasma etch. A relatively thin layer of photoresist is used in the process to enable the project to enable extremely fine geometry. However, there is taught no use of faceting to avoid redeposition nor use of getter material in an atmosphere to slow down the etch rate thereof.

BRIEF DESCRIPTION OF THE INVENTION

The invention is a method of minimizing redeposition of thin film material being removed by ion impact via a patterned resist mask, which invention determines the resist mask etching rates in selected atmospheres and determines the material etching rates in selected atmospheres. Then the mask thickness is selected relative to the material thickness, the ambient gases, and the ion beam parameters to cause the resist mask to be faceted to the edges of underlying material as the unprotected layer is removed such that no resist walls remain to receive redeposited material. A different embodiment of the invention employs a getter mask material between the resist mask and said material where the thickness and etching rates of resist, said material and getter material are relatively selected to cause the unprotected getter material to be removed shortly prior to faceting of the resist down to the protected getter material in a first environment, and continues etching the thin film material in a different environment which also causes resist removal while eroding the getter mask very slowly. The getter mask can thus be very thin to minimize redeposition.

DESCRIPTION OF A PREFERRED EMBODIMENT OF THE INVENTION

Figure 9:
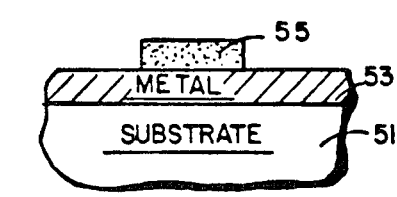
FIG. 9 shows a preferred embodiment where the resist is placed over the material or metal to be etched; and, FIG. 10 shows the completion of etching where the resist facets have just reached the material or metal surface and the unprotected material or metal has been completely removed.
Figure 10:
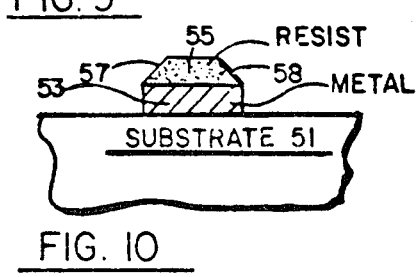

While the embodiment of the invention of FIGS. 9 and 10 is the preferred embodiment, it may be helpful initially to explain the other figures, e.g. the problem is illustrated in FIGS. 1, 2, 3 and 4.

Figure 1:
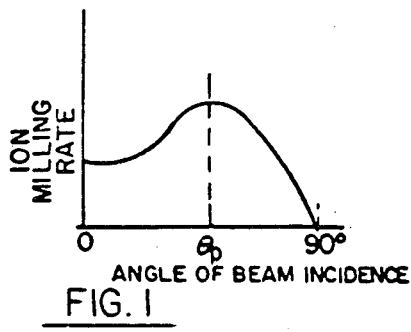
FIG. 1 shows etch rate versus incident angle for ion milling of a typical material.

FIG. 1 shows that maximum etch rate for ion milling typically occurs at non-normal incidence. This results in beveling of steps exposed to ion bombardment.

Figure 2:
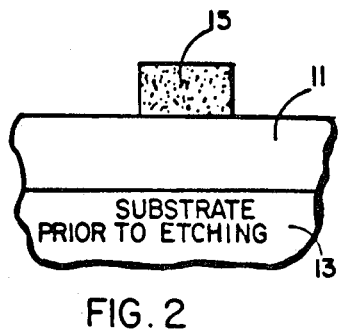
FIGS. 2, 3 and 4 illustrate the problem of redeposited material, FIG. 2 showing a resist on a material to be etched, FIG. 3 showing partial etching with faceting of the resist and FIG. 4 showing the material etched down to a substrate with the resist removed and with the redeposited material extending upwardly on both edges.

In FIG. 2 a typical material 11 to be patterned is carried by substrate 13 and has a resist pattern represented at 15 applied over the material 11.

Figure 3:
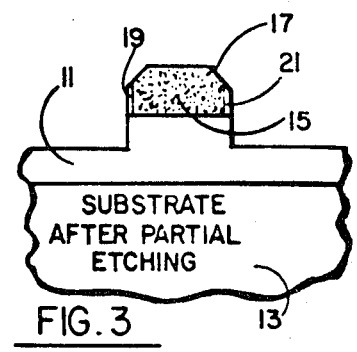

After partial etching by ion milling or by sputter etching, the resist 15 has developed the facets 17 as seen in FIG. 3 but also redeposition of the material 11 being removed on either side of the resist 15 occurs as the vertically extending redeposited material 19 and 21.

Figure 4:
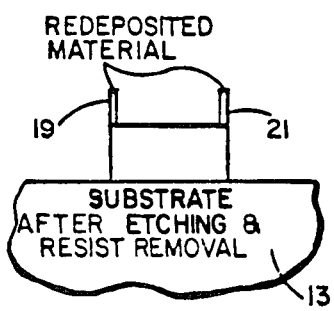

In FIG. 4 after the resist 15 is fully removed, the redeposited material 19 and 21 extends upwardly in the form of ears.

Particularly in the bubble memory field, it is necessary to have the permalloy or nickel iron formed with sharp edges and vertical patterned sidewalls with minimized redeposition because the presence of redeposited material degrades device performance.

Figure 5:
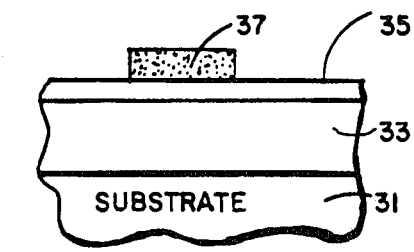
FIG. 5 shows the use of getter mask material between the resist and the material to be etched.
Figure 6:
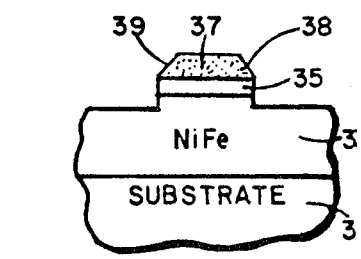
FIG. 6 shows partial etching where the facets of the resist have not yet reached the getter mask material.
Figure 7:
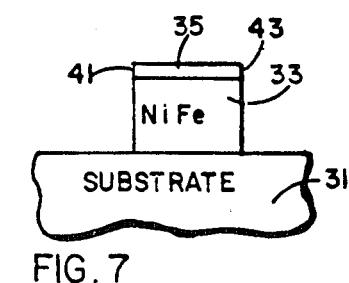
FIG. 7 shows the completed etching process wherein a thin layer of the getter mask remains with the redeposited material being minimized on its outer edges.

Accordingly, the dual mask etching arrangement of FIGS. 5 through 7 forms an embodiment of the present invention. In FIG. 5, substrate 31 carries a layer of material 33 to be etched (which may comprise the nickel iron or magnetic layer) in turn carrying a getter mask material 35 which is layered on top of the material to be etched. Finally, a patterned resist, represented at 37, completes the structure of FIG. 5.

The invention is concerned with the use of a very thin mask, as shown by getter mask material 35, which is etched very slowly. The thickness of layer 35 is related to the thickness of material 33 to be etched away and the etching rates and selected atmospheres in which the etching takes place contribute to attaining the desired result, which is shown in FIG. 6, wherein the unprotected regions of the material 33 are completely etched away, the resist material 37 is etched away and a portion of getter mask material 35 is etched away such that the redeposited material 41 and 43 is minimal. The remaining getter mask material may be removed at this point.

In FIG. 6 etching has proceeded to the point where facets 38 and 39 have been formed on the edge of resist material 37, representing an intermediate step between FIGS. 5 and 7.

Figure 8:
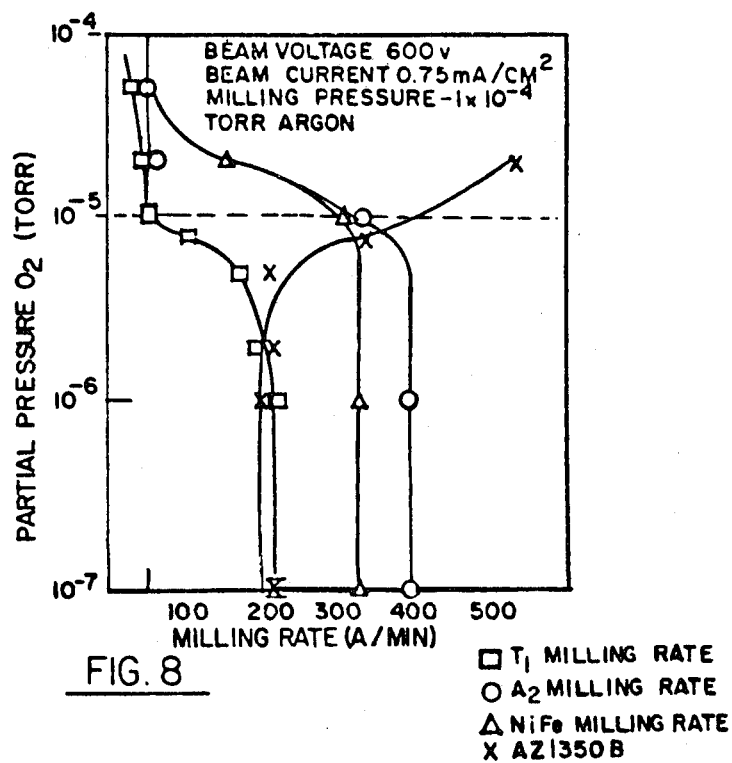
FIG. 8 is a plot of partial pressure $O_2$ against milling rate in angstroms per minute for titanium, aluminum, nickel iron and resist material.

By considering FIG. 8, the relative etch rates of several materials is shown and the principles of the invention may be better understood from a specific example. Nickel iron (NiFe) the material 33 to be etched by way of example, is represented by a curve shown by the triangles, wherein the ion milling rate in angstroms per minute is plotted against partial pressure of $O_2$ (TORR). The getter mask material 35 may comprise titanium or aluminum which milling rates are also shown, and the resist material may be standard AZ1350B, a novolac-based resist commercially available from the Shipley Corporation represented by resist 37. FIG. 8 is drawn utilizing an ion milling system at 600 eV argon ions, 0.75 mA/cm² beam.

Looking at FIG. 8, at zero partial pressure of $O_2$, the Ti etches at about the same rate as the AZ1350B. However at $1 \times 10^{-5}$, TORR $O_2$ in $1 \times 10^{-4}$ TORR Ar, the NiFe etches six times as fast as the Ti and AZ1350B etches eight times as fast.

With the foregoing in mind, a specific example is as follows:
(1) deposit approximately 4,000 Å NiFe as in conventional procedures for bubble memory fabrication. This represents the material 33 of FIGS. 5 through 7, deposited on substrate 31.
(2) deposit approximately 800 Å Ti on layer 33, as shown at 35.
(3) spin on and pattern approximately 5,000 Å AZ1350B.
(4) etch the Ti in an ambient of pure argon.

By this time, the facets 38 and 39 of resist 37 do not quite reach the upper level of the getter mask material Ti shown at 35 (see FIG. 6).
(5) Introduce $1 \times 10^{-5}$ torr $O_2$ into $1 \times 10^{-4}$ argon and continue milling until the NiFe is etched, by which time the resist is stripped and the residual Ti is about 200 Å thick, as shown in FIG. 7.

The Ti then may be left either in place or removed leaving a maximum of a few hundred angstroms of redeposition as shown by 41 and 43 in FIG. 7.

The most preferred embodiment of the invention is pictured in FIGS. 9 and 10 where the getter mask material 35 has been eliminated and the substrate 51 carries the material 53 to be milled with the patterned resist 55 being over the material 53. The thickness of resist 55 is $X_R$ and the thickness of the material to be milled 53 is $X_M$ where $X_R = f(X_M)$ such that the bevels or facets 57 and 58 are etched down to the upper surface of material 53 just as the material 53 is etched to the upper surface of substrate 51. Thus, it may be seen that there are no sidewalls of resist on which redeposition can be built or deposited and an optimum structure is obtained. While this process affects the linewidths because of redeposition along the sidewalls of the material 53 to be etched, such effects may be compensated in the patterning step.

The method of determining $X_R = f(X_M)$ is as follows:
The time to etch material 53 to the upper surface of substrate 51 is $$t_M = \frac{X_M}{R_0^M} \quad (1)$$

and the time for the beveled edge of the resist material 55 to reach the surface of material 53 is:

$$t_R = \frac{X_R}{R_{\theta_p}^R} \cos \theta_p^R \quad (2)$$

where $X_M$ = thickness of material 53; $R_0^M$ = milling rate of material 53 at normal incidence; $X_R$ = thickness of resist 55; $R_{\theta_p}^R$ = peak milling rate = rate of erosion of beveled step edge; $\theta_p$ = angle of ion beam incidence for maximum erosion rate. The desired result is $t_M = t_R$, that is, the beveled resist edge 57 should intersect the material 53 just as material 53 is removed from substrate 51 on unmasked portions of the sample being milled. This result may be written:

$$X_R = X_M \frac{R_{\theta_p}^R}{R_0^M \cos \theta_p^R} \quad (3)$$

Consider for example, the case of a 5000 Å aluminum film which is to be patterned by ion milling using Shipley AZ1350J, a novolac-based resist commercially available from the Shipley Corporation, resist with no significant redeposition.

For an argon ion beam at 60° ev and 0.75 mA/cm², we have:

$R_0^{Al} = 400$ Å/min, $R_{\theta_p}^{AZ1350J} = 560$ Å/min, and $\cos \theta_p^{AZ1350J} = \cos 60° = 0.5$.

Substituting these values into Equation (3), we have $X_R = 14,000$ Å AZ1350J resist to mill $X_M = 5000$ Å Al.

The milling time as given by Equation (1) or Equation (2) is 12.5 minutes. Normal incidence milling was used in this example for clarity, but for certain processes it might be desirable to use non-normal incidence. The arithmetic in this case is slightly more involved, but the principle remains the same.

In FIGS. 9 and 10, the resist may be the same as presented heretofore, with the material 53 being typically NiFe, aluminum, gold or another metal.

Since other modifications of the present invention may occur to those skilled in the art, it is intended that the scope of the invention be defined by the appended claims.

I claim:
1. The method of minimizing redeposition of thin layer material being removed by ion impact via a patterned resist mask having rectangular cross section, comprising the steps of:
  determining the resist mask etching rates in selected atmospheres;
  determining the material etching rates in selected atmospheres;
  selecting the mask thickness relative to the material thickness and the atmosphere for ion impact to cause the resist mask to be faceted to the edges of underlying material as the unprotected portions of the layer of material are removed such that no resist walls remain to receive redeposited material at the completion of etching said material, and said faceting is simultaneously completed with the removal of the last of the exposed material.

2. The method of claim 1, wherein:
said material is metal; and
ion impact is caused by ion milling.

3. The method of claim 1, wherein:
ion impact is caused by sputter etching.

4. The method of claim 1, wherein: the thickness of the ion etch resist mask, $X_R$, is determined for normal incidence ion etching by the formula:

$$X_R = X_M \frac{R^R_{\theta_p}}{R^M_0 \cos \theta_p^R}$$

where:
$X_M$ = thickness of material to be etched
$R_{\theta_p}^R$ = rate of erosion of the bevels of the resist mask
$\theta_p^R$ = angle of maximum ion erosion rate for the resist material (bevel normal to ion direction)
$R_0^M$ = rate of erosion of the material to be etched at normal (0°) incidence.

* * * * *